United States Patent [19]

Schenck

[11] Patent Number: 5,220,208

[45] Date of Patent: Jun. 15, 1993

[54] CIRCUITRY AND METHOD FOR CONTROLLING CURRENT IN AN ELECTRONIC CIRCUIT

[75] Inventor: Stephen R. Schenck, McKinney, Tex.

[73] Assignee: Texas Instruments Incorporated, Dallas, Tex.

[21] Appl. No.: 693,978

[22] Filed: Apr. 29, 1991

[51] Int. Cl.$^5$ .......................................... H03K 17/16
[52] U.S. Cl. ................................ 307/443; 307/452; 307/542
[58] Field of Search ............... 307/443, 440, 452, 453; 327/542

[56] References Cited

U.S. PATENT DOCUMENTS

| | | | |
|---|---|---|---|
| 4,924,120 | 5/1990 | Schenck | 307/542 |
| 4,959,563 | 9/1990 | Schenck | 307/448 |
| 4,963,772 | 10/1990 | Dike | 307/443 |
| 4,968,906 | 11/1990 | Pham et al. | 307/443 |

Primary Examiner—James B. Mullins
Attorney, Agent, or Firm—Richard Donaldson; Robby T. Holland; Thomas G. Eschweiler

[57] ABSTRACT

Circuitry is provided for controlling current in an electronic circuit by determining a rating of the electronic circuit in response to a measured propagation of a signal during a fixed period of time and by controlling current through an output node of the electronic circuit in response to the rating. The current may be controlled by magnitude or by rate of change with respect to time. By controlling current in response to the rating, timing disparities between and within electronic circuits are reduced, and signal noise in an electronic circuit is reduced by lowering unnecessary amounts of current driving the output node and/or by lowering unnecessarily high DI/DT rates of change in current driving the output node.

12 Claims, 4 Drawing Sheets

CIRCUITRY AND METHOD FOR CONTROLLING CURRENT IN AN ELECTRONIC CIRCUIT

TECHNICAL FIELD OF THE INVENTION

This invention relates in general to electronic circuits, and more particularly to a circuit and method for controlling current in an electronic circuit.

BACKGROUND OF THE INVENTION

Advancement in the integrated circuit technology has lead to vast improvements in the speeds of integrated circuits. Increasing integrated circuit speed has resulted in faster rise and fall times of output voltages in response to new inputs. Similarly, the fast rise and fall times of the output voltages have resulted in abrupt transitions of output current.

While faster speeds are very desirable, the abrupt transitions of output current create serious problems. The drive capability of circuits is measured by the DC output current which can be sourced or sunk at specific voltages. The circuit must meet this current under worst-case or weak processing conditions, which in CMOS are low supply voltage, high temperature, or weak device models. A problem with standard circuit designs is that excessive DI/DT is generated under best-case or strong conditions, which in CMOS are high supply voltage, low temperature, and strong device models. Furthermore, under best-case processing conditions, levels of current provided by the circuit commonly are substantially higher than minimum levels required by product specifications.

Differences between weak process circuits and strong process circuits in levels of current and in DI/DT have resulted in timing disparities between and within electronic circuits, along with increased signal noise when DI/DT is high or when higher levels of current are used to drive an output.

Therefore, it may be seen that a need has arisen for a method and apparatus for controlling current to reduce timing disparities between and within electronic circuits and for controlling current to reduce signal noise by lowering unnecessary amounts of current driving an output and/or by lowering unnecessarily high DI/DT rates of change in the current driving an output, in response to environmental conditions such as temperature, overall voltage levels in an electronic circuit, and manufacturing process tolerances.

SUMMARY OF THE INVENTION

In one aspect of the present invention, circuitry is provided for controlling current in an electronic circuit. The circuitry comprises circuitry for determining a rating of the electronic circuit responsive to a measured propagation of a signal during a fixed period of time. The circuitry further comprises an output node and circuitry for controlling current through the output node responsive to the rating.

This aspect of the present invention provides the technical advantage of reducing timing disparities between and within electronic circuits. Another technical advantage provided by this aspect of the present invention is that signal noise in an electronic circuit is reduced by lowering unnecessary amounts of current driving the output node and/or by lowering unnecessarily high DI/DT rates of change in current driving the output node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-7 of the drawings, like numerals being used for like and corresponding parts of the various drawings.

Figure 1:
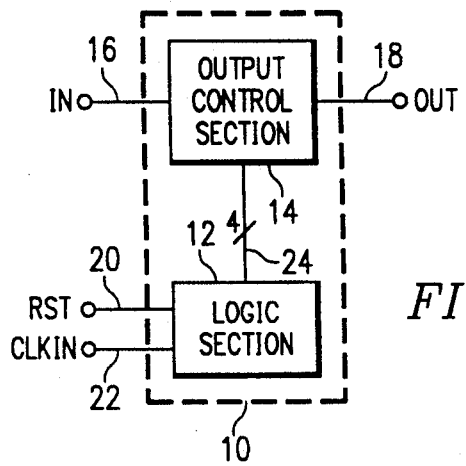
FIG. 1 illustrates a block diagram of a circuit in an electronic circuit of the present invention.

FIG. 1 illustrates a block diagram of a circuit in an electronic circuit of the present invention. Circuit 10 comprises logic section 12 and output control section 14. Output control section 14 receives input data signals at input node 16 and produces output data signals at output node 18. Logic section 12 receives a reset signal at RST node 20 and receives a clock signal at CLKIN node 22. Logic section 12 provides control lines 24 to output control section 14.

Output control section 14 receives input data from input node 16 and then provides this data to output node 18 in a manner specified by control lines 24 from logic section 12. Output control section 14 may control the amount of current which drives output node 18, or alternatively may control the rate of change of current which drives output node 18. The rate of change of current is commonly referred to as DI/DT.

Differences between weak process circuits and strong process circuits in levels of current and in DI/DT commonly result in timing disparities between and within electronic circuits. Since logic section 12 is proximate the output control section 14, it will be subject to the same processing and environmental conditions. Therefore, logic section 12 determines a rating which is indicative of the speed of the electronic circuit responsive to a measured propagation of a signal during a fixed period of time. Propagation of the signal during a fixed period of time will vary according to temperature, overall voltage levels in the electronic circuit, and manufacturing process tolerances. Typically, strong processing conditions together with high voltage levels and low temperatures result in faster propagation of the signal through the electronic circuit.

By determining a rating of the electronic circuit, logic section 12 may provide signals over control lines 24 to control the levels of output current, or of DI/DT associated with the circuit 10, such that circuit 10 may control the rise and fall times of a voltage provided at output node 18 in response to a voltage received at input node 16. Thus, for faster electronic circuits, logic section 12 outputs a rating to output control section 14 indicating that output control section 14 should provide slow rise and fall times for a voltage signal at output node 18. Likewise, for slower electronic circuits, logic section 12 outputs a rating indicating that output control section 14 should provide fast rise and fall times for a voltage signal at output node 18.

Output control section 14 may control the rise and fall times of a voltage provided at output node 18 by controlling the amount of current driving output node 18 or by controlling the DI/DT rate of change in the current driving output node 18. Consequently, circuit 10 may slow an output of a faster electronic circuit to synchronize timing with a slower electronic circuit, or it may speed an output of a slower electronic circuit to synchronize timing with a faster electronic circuit, or it may do a combination of both to synchronize timing. Similarly, circuit 10 may slow or speed an output of a particular section of an electronic circuit to synchronize timing with another section of the same electronic circuit.

Commonly, circuit 10 generates increased signal noise when DI/DT is higher, or when higher levels of current are used to drive output node 18. Since signals propagate more quickly through the electronic circuit under strong processing conditions or low temperatures, circuit 10 is not required to switch data on output node 18 as quickly as would be required where signals propagate more slowly through the electronic circuit, because the electronic circuit more quickly provides data at input node 16, thereby allowing circuit 10 additional time to provide data at output node 18 while still satisfying product specifications for overall propagation delay. Consequently, the rating generated by logic section 12 may be used to lower DI/DT to a level below that produced by a weak process circuit by taking advantage of the increased speed of the other portions of the electronic circuit. By lowering unnecessarily high DI/DT rates of change in the current driving output node 18, circuit 10 reduces signal noise.

Logic section 12 may also control the level of current driving output node 18, again based on a measured propagation of a signal through logic section 12 during a fixed period of time. A faster propagation of the signal during the fixed period of time will indicate higher voltage levels, lower temperatures, or improved manufacturing conditions. Under these circumstances, levels of current provided by output control section 14 commonly are substantially higher than minimum current levels required by product specifications. Thus, logic section 12 may be used to control the current through output node 18, thereby reducing signal noise.

Therefore, circuit 10 is able to control levels of current and rates of DI/DT in response to environmental conditions such as temperature, overall voltage levels in the electronic circuit, and manufacturing process tolerances, as reflected by a rating of the electronic circuit responsive to a measured propagation of a signal during a fixed period of time.

Figure 2:
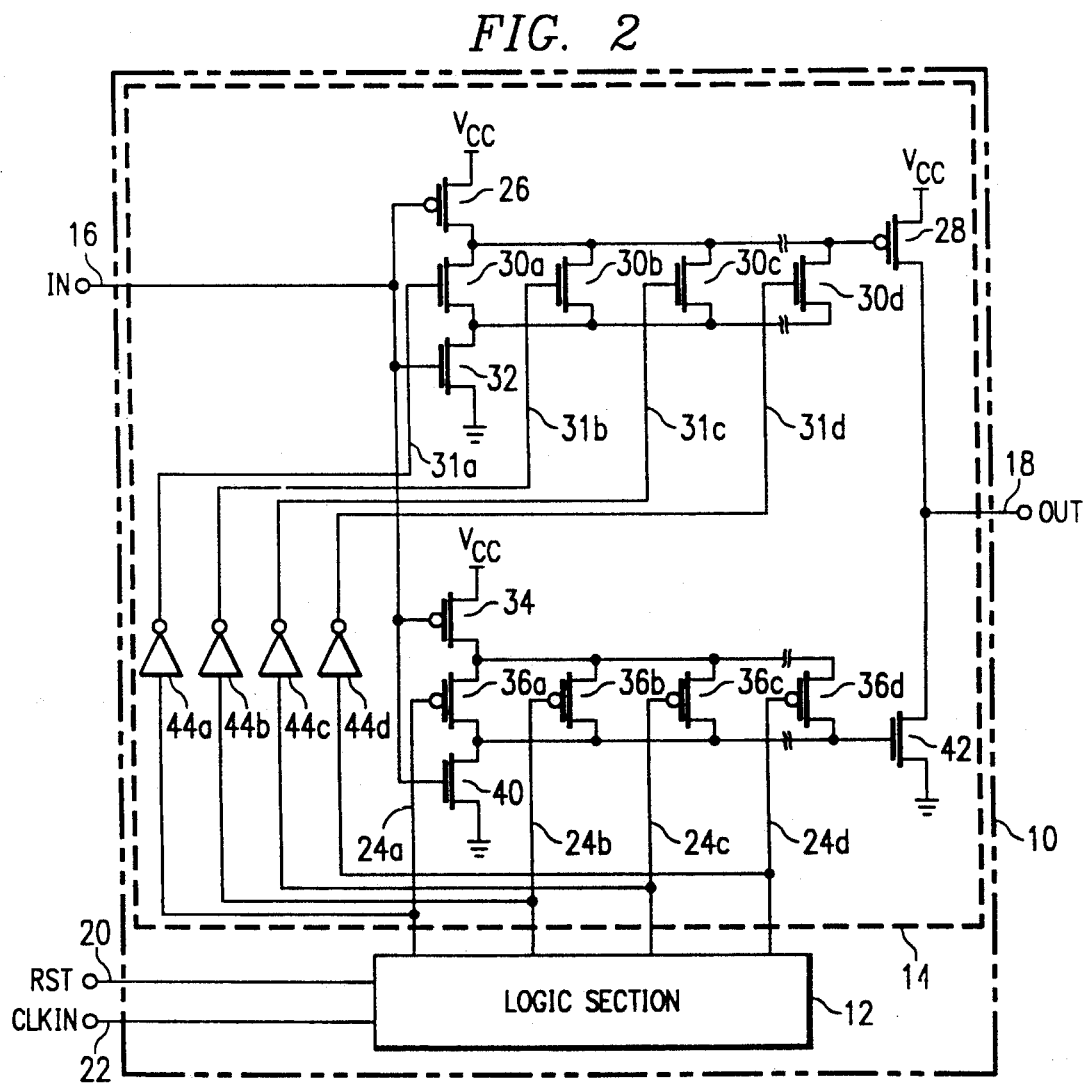
FIG. 2 illustrates a schematic representation of a first embodiment of the output control section of the circuit of the present invention.

FIG. 2 illustrates a first embodiment of output control section 14 of circuit 10 of the present invention. Output control section 14 comprises a P channel transistor 26 having its source connected to $V_{cc}$, its gate connected to input node 16, and its drain connected to the gate of P channel output transistor 28. N channel transistors 30a–d each have a corresponding drain connected the drain of P channel transistor 26 and each have a corresponding gate connected to a respective one of inverted control lines 31a–d. N channel transistor 32 has its drain connected to the respective sources of N channel transistors 30a–d. N channel transistor 32 has its gate connected to input node 16 and has its source connected to ground.

P channel transistor 34 has its source connected to $V_{cc}$ and its gate connected to input node 16. P channel transistors 36a–d each have a corresponding source connected to the drain of P channel transistor 34 and each have a corresponding gate connected to a respective one of control lines 24a–d. N channel transistor 40 has its drain connected to the respective drains of P channel transistors 36a–d, and also connected to the gate of N channel output transistor 42. N channel transistor 40 has its gate connected to input node 16 and its source connected to ground.

Inverters 44a–d respectively input control lines 24a–d and respectively output inverted control lines 31a–d. P channel output transistor 28 has its source connected to $V_{cc}$ and its drain connected to output node 18. N channel output transistor 42 has its drain connected to output node 18 and its source connected to ground.

Control lines 24a–d control the DI/DT of N channel output transistor 42, and inverted control lines 31a–d control the DI/DT of P channel output transistor 28. Hence, the DI/DT of output node 18 may be controlled by logic section 12 via control lines 24a–d. This aspect of output control section 14, along with alternative embodiments of output control section 14, are described further in U.S. Pat. No. 4,924,120, entitled "Low Noise Output Circuit", Stephen Robert Schenck, issued May 8, 1990, and by U.S. Pat. No. 4,959,563, entitled "Adjustable Low Noise Output Circuit", Stephen Robert Schenck, issued Sep. 25, 1990, which patents are both incorporated by reference herein.

In response to a voltage received at input node 16, the rise and fall time of a voltage provided at output node 18 is dependent upon the number of transistors 30a–d and 36a–d that are turned on. As additional ones of transistors 30a–d and 36a–d are turned on, DI/DT of output node 18 is increased. In an exemplary embodiment, in response to a voltage received at input node 16, the rise and fall time of a voltage provided at output node 18 will increase by a factor of 1.7 as successive ones of control lines 24a–d are low, thereby turning on successive ones of transistor pairs 30a and 36a, 30b and 36b, 30c and 36c, and 30d and 36d. This factor of 1.7 may be modified in a particular embodiment by appropriately selecting transistors as necessary to effectively synchronize timing or to further reduce signal noise.

While logic section 12 is shown as generating outputs on four control lines 24a–d, additional control lines may be provided along with respective inverters 44, N channel transistors 30 and P channel transistors 36.

In an alternative embodiment, the gates of N channel transistors 30a–d may be operated by logic section 12 independently of the gates of P channel transistors 36a–d. In this alternative embodiment, logic section 12 provides additional control lines directly connected to the gates of N channel transistors 30a–d in place of inverted control lines 31a–d.

Figure 3:
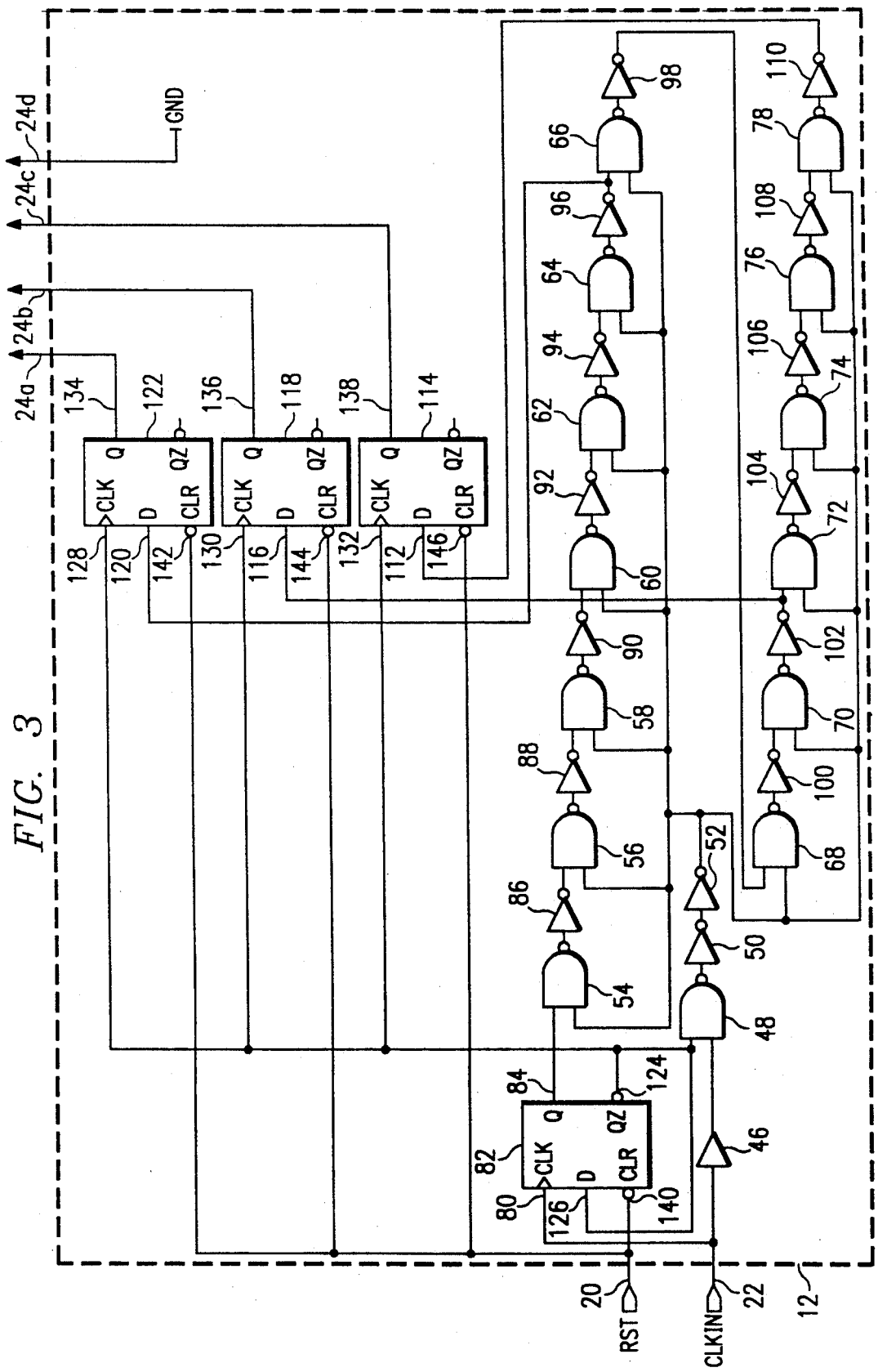
FIG. 3 illustrates a schematic representation of the logic section of the circuit of the present invention.

FIG. 3 illustrates logic section 12 of circuit 10 of the present invention. Logic section 12 determines a rating of the electronic circuit responsive to a measured propagation of a signal during a fixed period of time. CLKIN node 22 is connected to the input of buffer/driver 46. The output of buffer/driver 46 is connected to an input of NAND gate 48. The output of NAND gate 48 is connected to the input of inverter 50. The output of inverter 50 is connected to the input of inverter 52. The output of inverter 52 is connected to a respective input of NAND gates 54, 56, 58, 60, 62, 64, 66, 68, 70, 72, 74, 76 and 78. CLKIN node 22 is also connected to CLK input 80 of D flip-flop 82. Output 84 of D Flip-Flop 82 is connected to an input of NAND gate 54. The output of NAND gate 54 is connected to the input of inverter 86 whose output is connected to an input of NAND gate 56. The output of NAND gate 56 is connected to the input of inverter 88 whose output is connected to an input of NAND gate 58. The output of NAND gate 58 is connected to the input of inverter 90 whose output is connected to an input of NAND gate 60. The output of NAND gate 60 is connected to the input of inverter 92 whose output is connected to an input of NAND gate 62. The output of NAND gate 62 is connected to the input of inverter 94 whose output is connected to an input of NAND gate 64. The output of NAND gate 64 is connected to the input of inverter 96 whose output is connected to an input of NAND gate 66. The output of NAND gate 66 is connected to the input of inverter 98 whose output is connected to an input of NAND gate 68. The output of NAND gate 68 is connected to the input of inverter 100 whose output is connected to an input of NAND gate 70. The output of NAND gate 70 is connected to the input of inverter 102 whose output is connected to an input of NAND gate 72. The output of NAND gate 72 is connected to the input of inverter 104 whose output is connected to an input of NAND gate 74. The output of NAND gate 74 is connected to the input of inverter 106 whose output is connected to an input of NAND gate 76. The output of NAND gate 76 is connected to the input of inverter 108 whose output is connected to an input of NAND gate 78. The output of NAND gate 78 is connected to the input of inverter 110 whose output is connected to data input 112 of D flip-flop 114. The output of inverter 102 is further connected to data input 116 of D flip-flop 118. The output of inverter 96 is further connected to data input 120 of D flip-flop 122.

Inverted output 124 of D flip-flop 82 is connected to data input 126 of D flip-flop 82, to an input of NAND gate 48, to CLK input 128 of D flip-flop 122, to CLK input 130 of D flip-flop 118, and to CLK input 132 of D flip-flop 114.

Output 134 of D flip-flop 122 is connected to control line 24a. Output 136 of D flip-flop 118 is connected to control line 24b. Output 138 of D flip-flop 114 is connected to control line 24c. Control line 24d is connected to GND.

RST node 20 is connected to inverted CLR input 140 of D flip-flop 82, to inverted CLR input 142 of D flip-flop 122, to inverted CLR input 144 of D flip-flop 118, and to inverted CLR input 146 of D flip-flop 114.

As additional ones of transistors 30a–d and 36a–d in FIG. 2 are turned on, DI/DT of circuit 10 is increased. In the illustrated embodiment, control line 24d is connected to GND and is therefore always low. The output of control lines 24a–c vary according to whether a signal has propagated through a particular number of logic gates within a fixed period of time. Since the logic circuitry 12 is proximate the output control section 14, it will be subject to the same processing and environmental conditions. These conditions can be measured by propagating a signal through the serially connected logic gates (NAND gates 54–78 and inverters 86–110). For the slowest propagation of a signal, control lines 24a–c will each be low, along with control line 24d. When control lines 24a–d are each low, output control section 14 shown in FIG. 2 produces maximum DI/DT, since transistors 30a–d and 36a–d will be enabled. For the fastest propagation of a signal, control lines 24a–c will each be high, and output control section 14 shown in FIG. 2 reduces DI/DT, because only N channel transistor 30d and P channel transistor 36d will be enabled, as specified by control line 24d being low. Thus, a logic table for control lines 24a–d is:

TABLE I

| 24a | 24b | 24c | 24d | |
|---|---|---|---|---|
| 0 | 0 | 0 | 0 | Speed 1 (slowest signal propagation) |
| 1 | 0 | 0 | 0 | Speed 2 |
| 1 | 1 | 0 | 0 | Speed 3 |
| 1 | 1 | 1 | 0 | Speed 4 (fastest signal propagation) |

Propagation of the signal during a fixed period of time is monitored by D flip-flop 122 at the output of inverter 96, by D flip-flop 118 at the output of inverter 102, and by D flip-flop 114 at the output inverter 110. A higher resolution of speed rating could be accomplished by providing additional latches coupled to the chain of NAND gates and inverters, along with additional respective control lines. The number of NAND gates and inverters can be increased or decreased depending on the range of propagation delays to be monitored. By using several gates to correspond with a particular control line, slight variations in the speed of each gate are averaged such that errors are reduced in measuring propagation through the chain of NAND gates and inverters.

The propagated signal is provided by output 84 of D flip-flop 82. Propagation of the signal during a fixed period of time is monitored by D flip-flops 122, 118 and 114 after twelve logic gates, eighteen logic gates, and twenty-six logic gates, respectively. Consequently, if the propagated signal is detected by D flip-flop 118, then the propagated signal is approximately 1.5 (eighteen gates/twelve gates) times faster than a propagated signal detected only by D flip-flop 122. Similarly, if the propagated signal is detected by D flip-flop 114, then the propagated signal is approximately 1.44 (twenty-six gates/eighteen gates) times faster than a propagated signal detected only by D flip-flop 118. Thus, by adding more logic gates to the chain of serially connected logic gates (NAND gates 54–78 and inverters 86–110) and/or by changing the gates whose outputs are monitored by D flip-flops 122, 118 and 114, the speed ratios (e.g., 1.44 between D flip-flops 114 and 118, and 1.5 between D flip-flops 118 and 122) could be modified as necessary to accommodate specific requirements of a particular embodiment of output control section 14, thereby enabling circuit 10 to effectively synchronize timing or to further reduce signal noise.

Since inverted output 124 of D flip-flop 82 is provided to data input 126 of D flip-flop 82, output 84 is toggled upon every low-to-high edge of a CLK signal provided at CLKIN node 22. Similarly, inverted output 124 toggles upon every low-to-high edge of a CLK signal provided at CLKIN node 22, such that inverted output 124 toggles from low-to-high once for every two low-to-high edges of a CLK signal provided at CLKIN node 22. Thus, output 84 and inverted output 124 operate as CLK signals having half the frequency of a CLK signal provided at CLKIN node 22. In this manner, output 84 may provide a high signal which propagates through the chain of NAND gates and inverters, and which remains high for a full cycle of a CLK signal provided at CLKIN node 22. On a low-to-high edge of inverted output 124, D flip-flops 114, 118, and 122 latch respective data inputs 112, 116, and 120.

In the sequence of operation, a CLK signal provided at CLKIN node 22 toggles from low-to-high and thereby causes inverted output 124 to move from low-to-high and output 84 to move from high-to-low. Hence, both inputs to NAND gate 48 will be high, and the output of NAND gate 48 will therefore be low, resulting in rapid simultaneous clearing to low of respective outputs of inverters 86 through 110.

When CLKIN node 22 toggles from high-to-low, inverted output 124 remains high and output 84 remains low. Since inputs to NAND gate 48 are no longer both high, the output of NAND gate 48 will be high, resulting in NAND gates 54-78 rapidly and simultaneously each having a high input and therefore being enabled to propagate a signal provided at output 84. Since output 84 remains low, the outputs of inverters 86-110 will remain low.

When CLKIN node 22 again toggles from low-to-high, inverted output 124 will move to high-to-low and output 84 will move from low-to-high. Since inputs to NAND gate 48 are not both high, each of NAND gates 54-78 will continue having a high input. Hence, the newly generated high signal on output 84 propagates through NAND gates 54-78 and inverters 86-110, resulting in the outputs of inverters 86-110 sequentially moving from low-to-high When CLKIN node 22 again toggles from high-to-low, the output of NAND gate 48 remains unchanged, and the signal from output 84 continues to propagate.

When CLKIN node 22 again toggles from low-to-high, inverted output 124 moves from low-to-high and thereby causes D flip-flops 114, 118 and 122 to latch the outputs of respective inverters 110, 102 and 96. In this manner, D flip-flops 114, 18 and 122 latch the propagation of the signal provided at output 84 during the fixed period of one full cycle of the CLK signal provided at CLKIN node 22. At this same point in operation, the outputs of inverters 86-110 are cleared to low and output 84 moves from high-to-low, as described further hereinabove.

When a low signal is provided at RST node 20, inverted output 124 is set to high and outputs, 134, 136, and 138 are set to low. In this manner, logic section 12 may be initialized and synchronized with a CLK signal provided at CLKIN node 22.

In the illustrated embodiment, the signal is propagated continuously, and the control lines 24a-d are updated constantly. This embodiment provides the advantage of updating the output control section 14 to accommodate changing environmental conditions. Alternatively, the control lines could be updated only on start-up, or at periodic time intervals.

Figure 4:
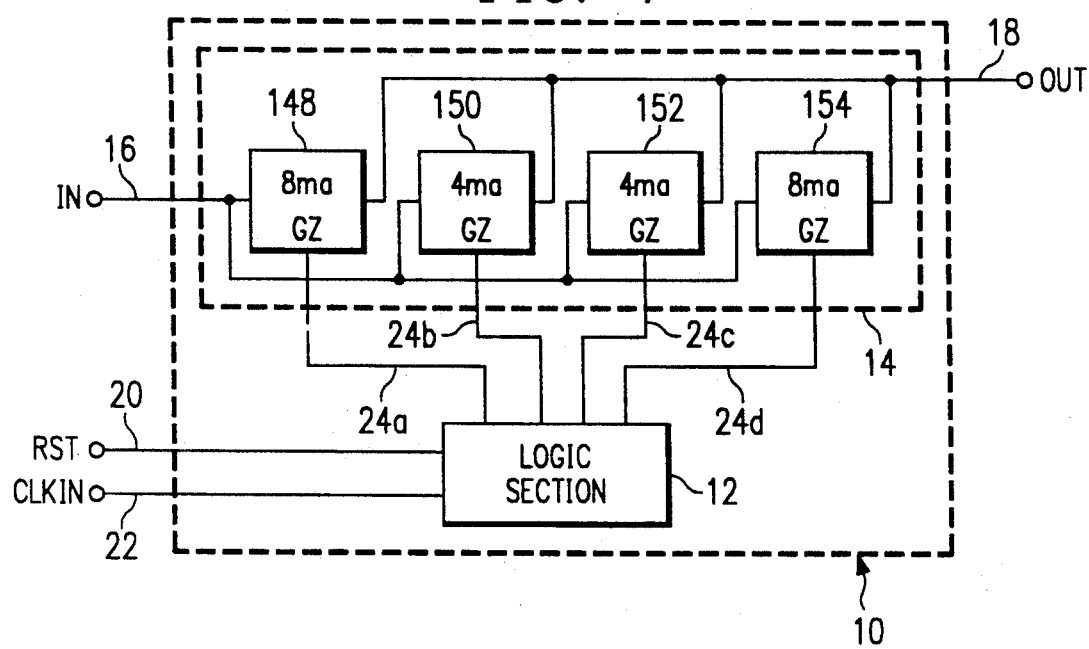
FIG. 4 illustrates a block diagram of a second embodiment of the output control section of the circuit of the present invention.

FIG. 4 illustrates a second embodiment of output control section 14 of circuit 10 of the present invention. Input node 16 provides an input data signal to output drivers 148, 150, 152 and 154. Logic section 12 provides control signals 24a-d to respective ones of output drivers 148-154. Output node 18 is connected to respective outputs of output drivers 148-154.

In an exemplary embodiment, output driver 148 has an 8 ma rating, output driver 150 has a 4 ma rating, output driver 152 has a 4 ma rating, and output driver 154 has an 8 ma rating. Although output driver 148 has an 8 ma rating, environmental conditions such as overall voltage levels in the electronic circuit, temperature, and manufacturing tolerances commonly result in actual current from output driver 148 being much greater than 8 ma, because the 8 ma rating denotes a minimum current from output driver 148. The actual current rating for strong conditions may be four times greater than the minimum current rating. Current from output drivers 150, 152, and 154 also vary in this manner. In the preferred embodiment, logic section 12 is proximate output control section 14, and the propagation of a signal during a fixed period of time indicates whether environmental conditions are such that output drivers 148-154 drive substantially more current than their respective minimum current ratings.

Consequently, if each of control lines 24a-d is low, then a signal will have propagated most slowly during the fixed period of time, thereby indicating that environmental conditions are such that output drivers 148-154 drive current at levels near their respective minimum current ratings. Low signals provided at control lines 24a-d will therefore enable each of output drivers 148-154 to drive a current at output node 18 approximately equal to 24 ma, which is the sum of the minimum current ratings for each of output drivers 148-154.

If the signal propagates most quickly during the fixed period of time, then only control line 24d will be low, and only output driver 154 will be enabled to drive output node 18. Although the minimum current rating for output driver 154 is 8 ma, the fact that the signal propagates most quickly during the fixed period of time indicates that environmental conditions are such that output driver 154 will output substantially more current than its 8 ma minimum rating. Since output driver 154 produces substantially more current than its 8 ma minimum rating, output driver 154 alone is capable of sufficiently driving output node 18. Consequently, by disabling output drivers 148-152 under these conditions, overall levels of signal noise produced by circuit 10 are substantially reduced, because unnecessary current is lowered.

Figure 5:
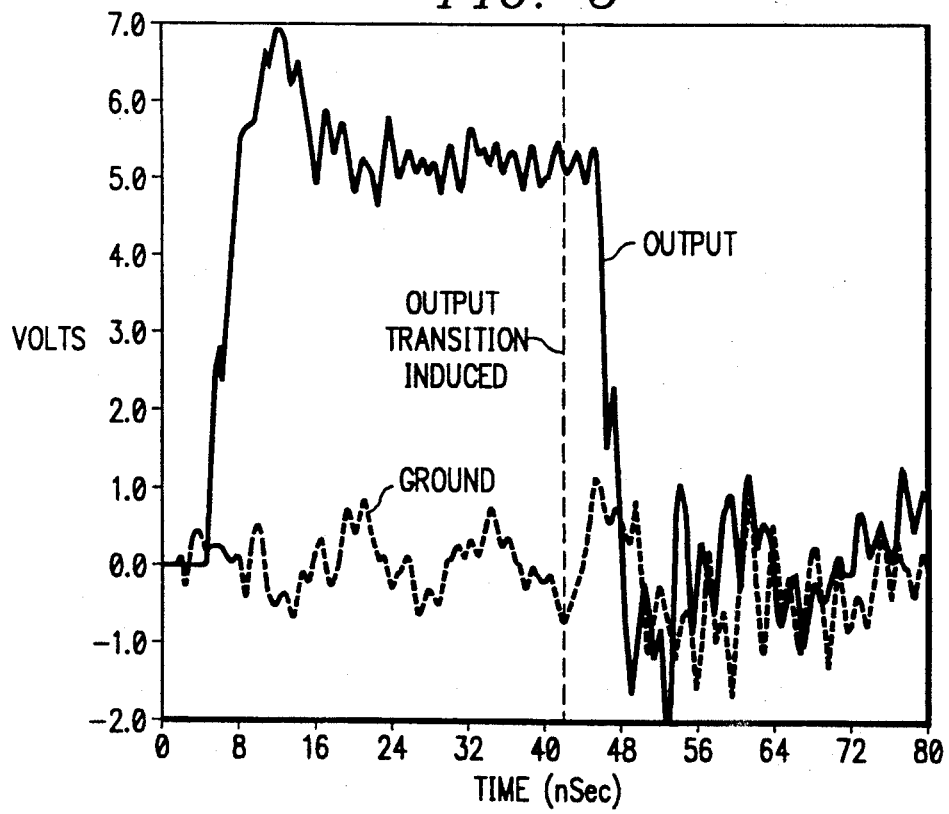
FIG. 5 illustrates a graph showing the voltage output by a previously developed circuit under strong processing conditions.

FIG. 5 illustrates a graph showing the voltage output by a previously developed circuit under strong processing and environmental conditions. After an output transition is induced at 42 nanoseconds, the voltage output continues oscillating at very high amplitudes which exceed one volt at 54 nanoseconds, 61 nanoseconds and 78 nanoseconds. Moreover, inductance causes the ground signal to fluctuate wildly after the output transition is induced, thereby producing more signal noise. As ground levels fluctuate, digital data readings are more prone to error, because a voltage output is measured with respect to ground.

Figure 6:
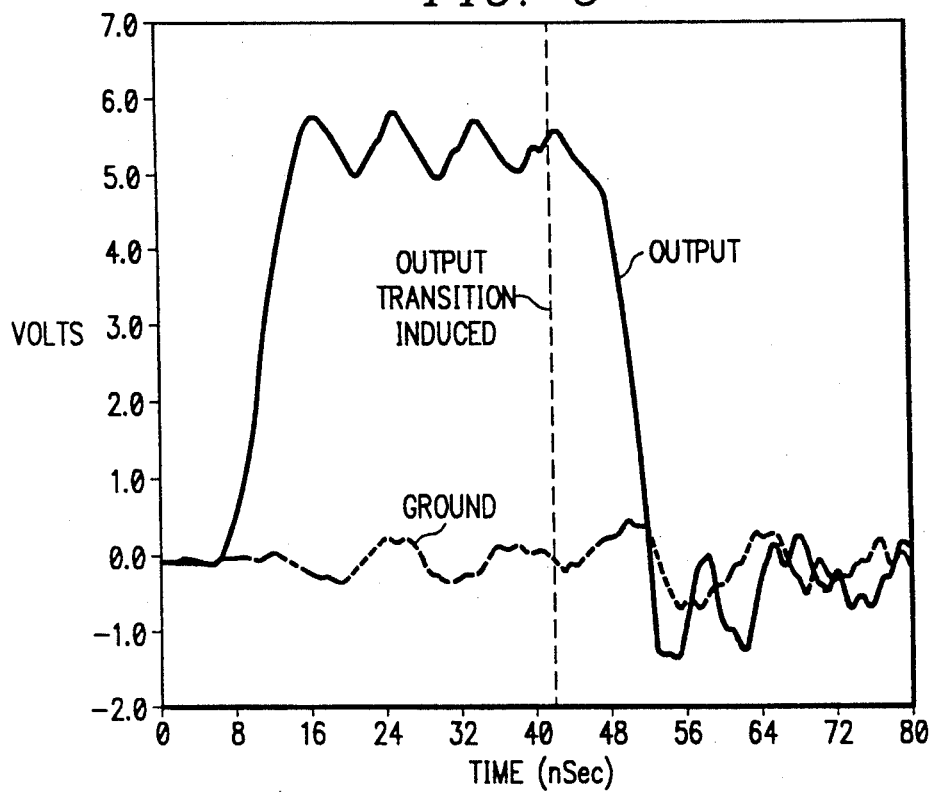
FIG. 6 illustrates a graph showing the voltage output by a circuit in accordance with the present invention under strong processing conditions.

FIG. 6 illustrates a graph showing the voltage output by a circuit in accordance with the preferred embodiment. This circuit operated under conditions similar to the circuit of FIG. 5. However, the DI/DT of the circuit in FIG. 6 was reduced to a minimum level, which was still sufficiently fast to meet product specifications for overall processing speed of the electronic circuit. After the output transition is induced at 42 nanoseconds, the voltage output steadily drops, and it always remains well below 0.5 volts after 52 nanoseconds. Similarly, the ground level exceeds 0.5 volts only once, at 50 nanoseconds.

Figure 7:
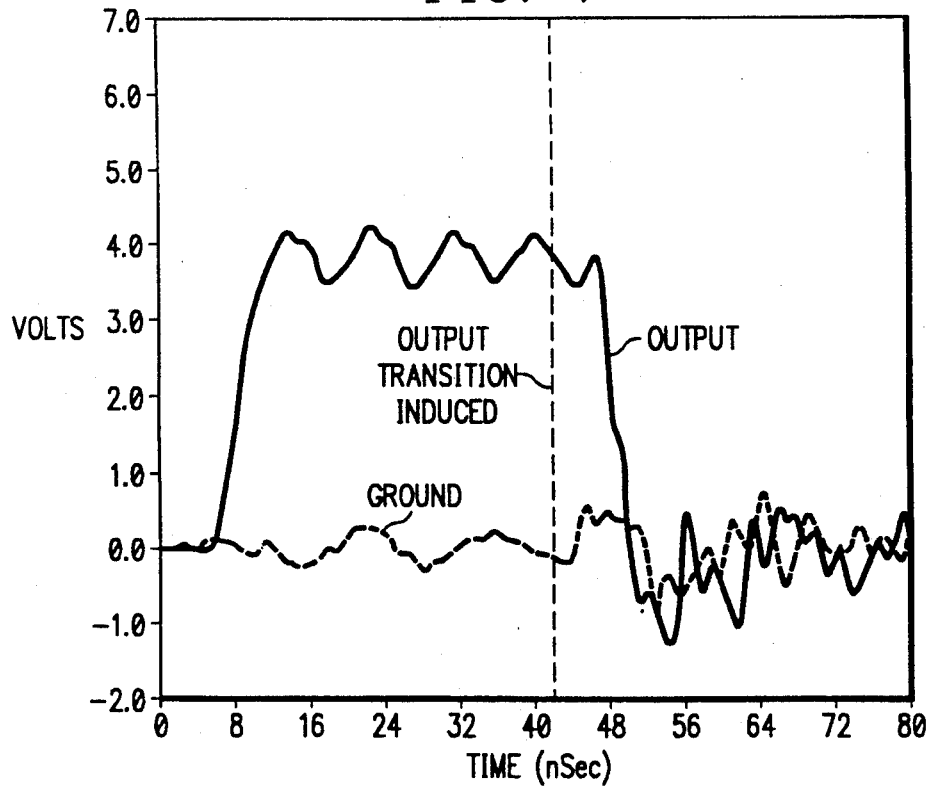
FIG. 7 illustrates a graph showing the voltage output by the previously developed circuit under weak processing conditions.

FIG. 7 illustrates a graph showing the voltage output by a previously developed circuit under weak processing conditions. Under these conditions, signal noise from the circuit is less than signal noise from the circuit of FIG. 5. However, signal noise generated by the circuit of FIG. 7 remains greater than signal noise generated by the circuit of FIG. 6. As shown, the voltage output in FIG. 7 reaches 0.5 volts at 56 nanoseconds and 66 nanoseconds, whereas the voltage output in FIG. 6 never reaches 0.5 volts after fifty-two nanoseconds. Similarly, the ground level in FIG. 7 fluctuates more extremely than the ground level in FIG. 6.

Therefore, a circuit equipped in accordance with the preferred embodiment operating under environmental conditions reflected in FIG. 6, may generate less signal noise than a circuit not equipped in accordance with the preferred embodiment which operates under more favorable environmental conditions reflected in FIG. 7.

Moreover, electromigration is commonly reduced in circuits equipped in accordance with the preferred embodiment.

Although the present invention and its advantages have been described in detail, it should be understood that various changes, substitutions and alterations can be made herein without departing from the spirit and scope of the invention as defined by the appended claims.

What is claimed is:

1. Circuitry for controlling current in an electronic circuit, comprising:
    circuitry for determining a rating associated with the electronic circuit responsive to a measured propagation of a signal during a fixed period of time;
    an output node; and
    circuitry for controlling the magnitude of current through said output node responsive to said rating.

2. The circuitry of claim 1 wherein said rating comprises a plurality of binary control signals.

3. The circuitry of claim 2 wherein said controlling circuitry comprises a plurality of output drivers controlled by said binary control signals.

4. A method for controlling current in an electronic circuit, comprising the steps of:
    determining a rating of the electronic circuit in response to a measured propagation of a signal during a fixed period of time; and
    controlling the magnitude of current through an output node of the electronic circuit in response to said rating.

5. The method of claim 4 wherein said step of determining comprises the step of determining a rating comprising a plurality of binary control signals.

6. The method of claim 5 wherein said step of controlling comprises the step of controlling each of a plurality of output drivers with said binary control signals.

7. The method of claim 4 wherein said step of determining comprises the steps of:
    propagating said signal through a plurality of logic gates coupled in series; and
    latching a plurality of outputs of said logic gates in response to a common clock signal.

8. The method of claim 7 and further comprising the step of inverting said propagated signal to form said common clock signal.

9. The method of claim 7 wherein said step of latching comprises the step of latching said outputs to form said rating.

10. The method of claim 7 and further comprising the step of dividing a system clock signal to produce said common clock signal.

11. The method of claim 7 and further comprising the step of initializing said outputs of said logic gates.

12. Circuitry for reducing timing disparities of an electronic circuit, comprising:
    circuitry for determining a rating associated with the electronic circuit responsive to a measured propagation of a signal during a fixed period of time;
    an output node; and
    circuitry for controlling current magnitude through said output node responsive to said rating, such that speed of voltage transition at said output node is controlled.

* * * * *